US011181580B2

(12) United States Patent
Zobel et al.

(10) Patent No.: US 11,181,580 B2
(45) Date of Patent: Nov. 23, 2021

(54) NON-VOLATILE COMPUTER DATA STORAGE PRODUCTION-LEVEL PROGRAMMING

(71) Applicant: Raytheon Company, Waltham, MA (US)

(72) Inventors: Matthew S. Zobel, Mammoth Lakes, CA (US); Brian R. Gonzales, Hermosa Beach, CA (US); Jose A. Becerra, Downey, CA (US); Javier Munoz, Hawthorne, CA (US)

(73) Assignee: RAYTHEON COMPANY, Waltham, MA (US)

( * ) Notice: Subject to any disclaimer, the term of this patent is extended or adjusted under 35 U.S.C. 154(b) by 78 days.

(21) Appl. No.: 16/592,053

(22) Filed: Oct. 3, 2019

(65) Prior Publication Data

US 2021/0102997 A1    Apr. 8, 2021

(51) Int. Cl.
| | | |
|---|---|---|
| *G01R 31/3185* | (2006.01) | |
| *G01R 31/3177* | (2006.01) | |
| *G11C 16/10* | (2006.01) | |
| *G11C 16/04* | (2006.01) | |
| *G11C 29/32* | (2006.01) | |

(52) U.S. Cl.
CPC . *G01R 31/318597* (2013.01); *G01R 31/3177* (2013.01); *G01R 31/318572* (2013.01); *G11C 16/04* (2013.01); *G11C 16/102* (2013.01); *G11C 29/32* (2013.01); *G11C 2029/3202* (2013.01)

(58) Field of Classification Search
CPC ........ G01R 31/318597; G01R 31/3177; G01R 31/318572; G11C 16/04; G11C 16/102; G11C 29/32; G11C 2029/3202
See application file for complete search history.

(56) References Cited

U.S. PATENT DOCUMENTS

| | | | |
|---|---|---|---|
| 6,937,493 B2 | 8/2005 | Krause et al. | |
| 7,757,198 B1 * | 7/2010 | Zhao | G06F 30/34 |
| | | | 716/103 |

(Continued)

FOREIGN PATENT DOCUMENTS

CN    1462979 A    12/2003

OTHER PUBLICATIONS

XJFlash FPGA-based ultra-fast Flash Programmer <https://www.xjtag.com/products/software/xjflash/> accessed Oct. 2, 2019 (8 pages).

*Primary Examiner* — Guy J Lamarre
(74) *Attorney, Agent, or Firm* — Cantor Colburn LLP

(57) ABSTRACT

A non-volatile computer data storage programming system includes a scan chain modification configured to receive a default model defining a scan chain of an industry standardized device. A controller is in signal communication with the scan chain modification system, and is configured to program an industry standardized device. A non-volatile computer data storage device is configured to receive data from the industry standardized device. The scan chain modification system modifies the default model to generate a new model including a reduced scan chain, and the controller programs the industry standardized device based on the new model such that the industry standardized device is programmed with the reduced scan chain.

20 Claims, 3 Drawing Sheets

(56) References Cited

U.S. PATENT DOCUMENTS

2010/0019774 A1* 1/2010 Wu ............... G01R 31/318575
  324/537
2012/0137186 A1* 5/2012 Portolan ........ G01R 31/318558
  714/727
2019/0339328 A1* 11/2019 Xiang ............ G01R 31/318335

* cited by examiner

NON-VOLATILE COMPUTER DATA STORAGE PRODUCTION-LEVEL PROGRAMMING

GOVERNMENT LICENSE RIGHTS

This invention was made with Government support under FA8523-16-F-0049 awarded by the United States Department of Defense. The Government has certain rights in the invention.

BACKGROUND

The present disclosure relates to electronic circuits, and more particularly, to a system and method for programming non-volatile computer data storage of an integrated circuit.

Programming time of chipsets in production level testing is critical to be as efficient as possible. Each generation of chipsets becomes larger and more difficult to program including external SPI Flash. Industry standardized programming tools such as those satisfying the standards established by the Joint Test Action Group (JTAG) have been developed to efficiently program large FPGA's and its SPI Flash storage.

SUMMARY

According to a non-limiting embodiment, a non-volatile computer data storage programming system includes a scan chain modification configured to receive a default model defining a scan chain of an industry standardized device. A controller is in signal communication with the scan chain modification system, and is configured to program an industry standardized device. A non-volatile computer data storage device is configured to receive data from the industry standardized device. The scan chain modification system modifies the default model to generate a new model including a reduced scan chain, and the controller programs the industry standardized device based on the new model such that the industry standardized device is programmed with the reduced scan chain.

According to another non-limiting embodiment, a scan chain modification system comprises a chain modification module configured to receive a default data file defining a model of an industry standardized device, and to generate a new data file that modifies the mode. The chain modification module is further configured to output the new data file to an industry standardized controller that configures the industry standardized device according to the modified model defined by the new data file.

According to yet another non-limiting embodiment, a method of programming non-volatile computer data storage device comprises receiving, via a scan chain modification system, an input default model defining a scan chain of an industry standardized device, the scan chain defining a first register length, and modifying, via the scan chain modification system, the default model to generate a new model defining a new scan chain that defines a second register length that is less than the first register length. The method further comprises programming, via a controller, the industry standardized device based on the new model such that the industry standardized device has the second register length; and programming the non-volatile computer data storage device using the FPGA operating according to the new scan chain.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
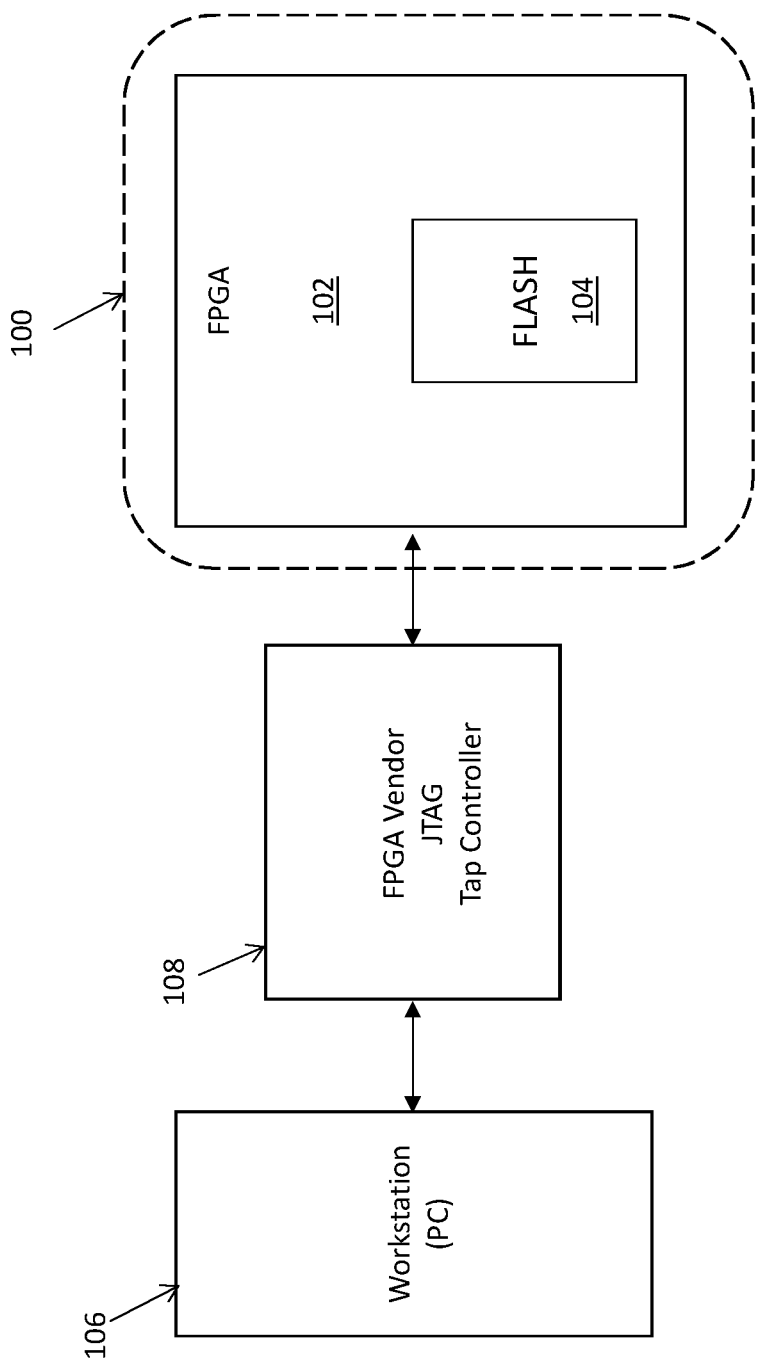
FIG. 1 is a block diagram of a non-volatile computer data storage programming system.

Production test environments aim to keep programming and testing times to a minimum. JTAG programming in a production setting has improved design efficiency by significantly reducing programming times of JTAG compliant devices. JTAG tools have been developed, which allow for a single button push approach to testing that simplifies the programming process. Referring to FIG. 1, for example, circuit card assemblies (CCAs) 100 employed with a Field Programmable Gate Array (FPGA) 102 have been developed to receive the flash memory 104 and facilitate the flash programming using a local workstation computer 106 and the FPGA vendor specific JTAG Tap Controller 108. For any given CCA there may be multiple devices present that have specific and different JTAG Tap Controllers. In a production environment, however, only a single programming pod is used and must be compatible with each vendor chipset. By moving from a preferred vendor programming pod and its vendor supplied software, an intermediate JTAG device (e.g., JTAG Technologies Tap Controller 108) connected between the computer 106 and FPGA 102 is required, which eliminates some of the JTAG tools and functionality previously available to designers and test engineers.

Standardized tools utilized in a production environment may at times lack a full suite of vendor supplied tools. As a result, engineers have been force to devote a portion of the design process to developing a unique solution or program for testing each vendor chipset. To overcome these time costs, venders or manufacturers have developed generic device boundary scan description language (BSDL) models that can be utilized by chip designers and engineers to program chipsets. However, these generic BSDL models define scan chains that can consist of thousands of elements that must be programmed before the corresponding component can be utilized. Thus, each programming instruction or cell takes time out of the JTAG programming sequence.

FPGAs require a large non-volatile computer data storage such as Flash memory, for example, to accommodate ever increasing programming file sizes. One of the interface options for image storage of the programming files is to use a Serial Peripheral Interface (SPI) to a SPI NOR Flash. The SPI option allows for limited pin usage, small component size, large memory storage, and fast configuration speed. During production programming, however, the FPGA causes speed difficulties. During initial board testing the FPGA SPI Flash needs to be programmed. As previously mentioned, venders or manufactures can provide a BSDL file which defines the BSDL model of the FPGA and allows a designer to configure, program and test the Flash and FPGA. However, a BSDL file for a JTAG enabled FPGA has a very long scan chain and causes Flash programming to take hours instead of the expected minutes with JTAG Technology tools. Consequently, the time needed to program JTAG devices continues to increase as more devices are developed within increasing scan chains.

Various non-limiting embodiments described herein provide a non-volatile computer data storage system configured to program non-volatile computer data storage (e.g., Flash memory) of a JTAG compliant device (e.g., a FPGA) while significantly reducing programming and testing times compared to currently known programming system and method. In one or more non-limiting embodiments, the non-volatile computer data storage system includes a scan chain modification system configured to alter the internal FPGA structure to establish a minimum scan chain necessary for meeting a given design application. In this manner, the time to program non-volatile computer data storage (e.g., Flash memory) can be reduced. For example, the non-volatile computer data storage system according to at least one non-limiting embodiment described herein has proven to program the Flash memory of a JTAG compliant FPGA by approximately two hundred times faster than known programming systems.

Figure 2:
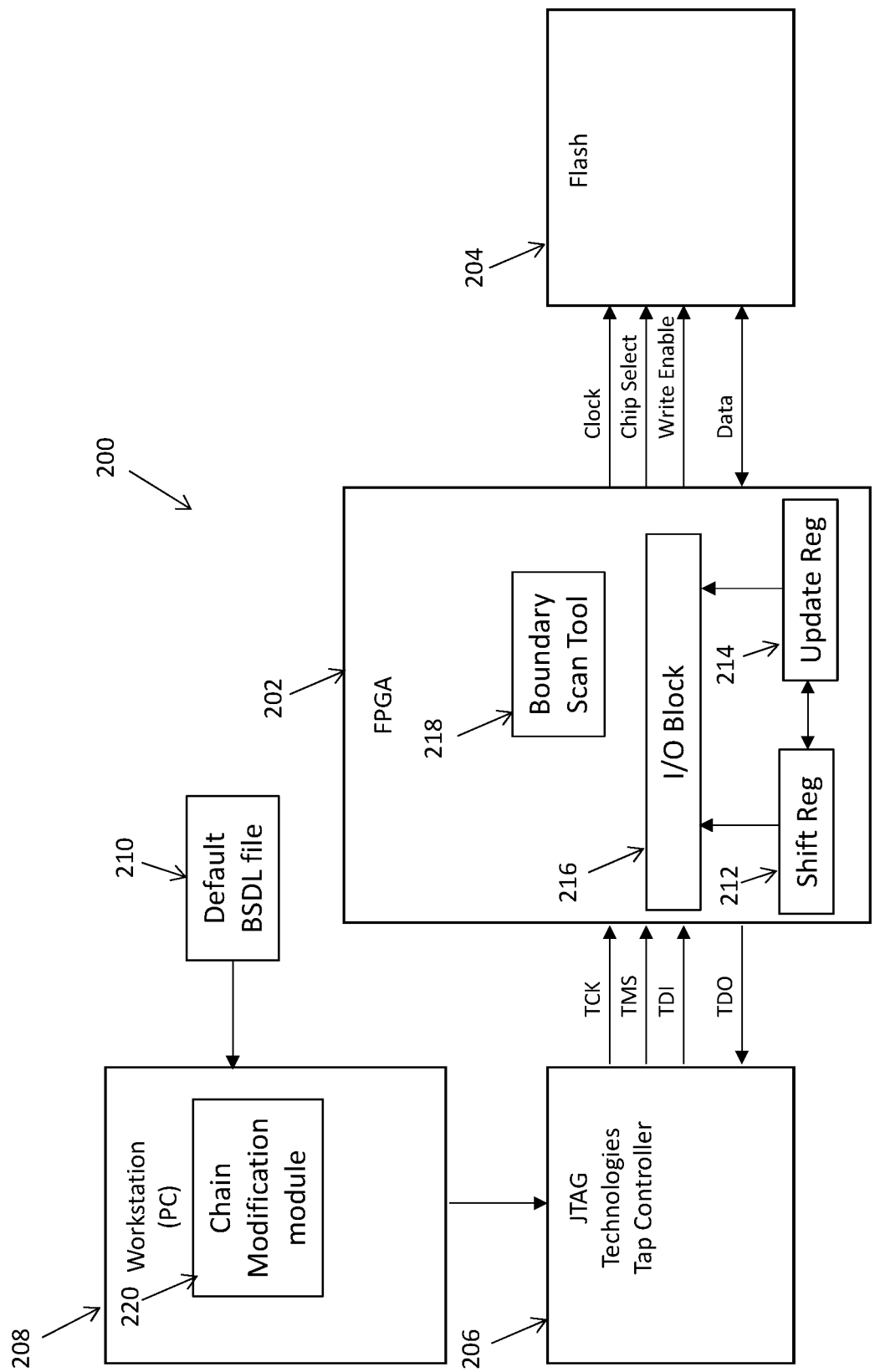
FIG. 2 is a block diagram of a non-volatile computer data storage programming system according to a non-limiting embodiment.

With reference now to FIG. 2, a non-volatile computer data storage programming system 200 (hereinafter referred to as programming system 200) is illustrated according to a non-limiting embodiment. The programming system 200 includes an industry standardized device 202, a non-volatile computer data storage 204 corresponding to the industry standardized device 202, a test access port (TAP) controller 206, and a scan chain modification system 208.

The industry standardized device 202 can include various chipsets that operate according to an industry standardized protocol and that can be utilized to program a corresponding non-volatile computer data storage 204 such as, for example, Flash memory 204. In at least one non-limiting embodiment, the industry standardized device 202 is a JTAG-compliant FPGA 202. That is, the FPGA 202 operates according to the JTAG protocol, which specifies the use of a dedicated debug port implementing a serial communications interface for low-overhead access without requiring direct external access to the system address and data buses. It should be appreciated, however, that other standardized devices can be employed including, but not limited to, an Application Specific Integrated Circuit (ASIC) and a Complex Programmable Logic Device (CPLD). The interface, which can include a debug port, connects to the TAP controller 206 and implements a stateful protocol to access a set of test registers that present chip logic levels and device capabilities of various parts. Although a JTAG-compliant FPGA 202 and corresponding flash memory 204 will be described going forward, it should be appreciated that other types of chipsets and non-volatile computer data storage can be employed without departing from the scope of the invention.

The FPGA 202 has a corresponding default data file 210 (e.g. a default BSDL file), which can be provided by the FPGA vendor. The BSDL file 210 represents a model of the FPGA 202, which defines thousands of cells or registers that can be programed. The BSDL file 210 can be input to the scan chain modification system 208, which then modifies the number of cells or registers of the FPGA 202 that require programming to below a targeted cell threshold, e.g., ten cells, or to meet the minimum number of cells necessary for programming the flash memory 204.

In general, the TAP controller 206 provides access to the FPGA 202. In one or more non-limiting embodiments, the FPGA 202 includes a boundary scan tool 218 that facilitates data exchange between the FPGA 202 and the control signals (TCK, TMS, TDI and TDO) of the TAP controller 206. The boundary scan tool 218 includes, for example, a component referred to as "BSCANE2", developed by Xilinx, Inc.

The TAP controller 206 includes a hardware electronic controller (e.g., microcontroller) that operates according to an industry standardized protocol such as, for example, JTAG. The TAP controller 206 communicates over JTAG to the FPGA 202. The FPGA 202 includes a shift register 212, an update register 214, and an I/O block 216. This shift register 212 performs various operations including, but not limited to, a load operation and a shift operation. The load operation loads data from parallel inputs when the TAP controller 206 is in a "Capture DR" state.

The length of the shift register 212 is based on the amount of pins necessary for a given application. Typically, one cell in the shift register 212 connects to one pin. If the pin can be tristated, one additional cell is needed to indicate that the pin has to be tri-stated or not. This architecture applies to both tristate and bidirectional pins.

The update register 214 holds the data that is sent to the pins and tristate controls. Accordingly, the update register 214 allows the shift register 212 to perform the shifting operation without simultaneously changing the values on the pins. The update register 214 can have a length that matches the length of the shift register 212. Alternatively, the update register 214 can omit update cells for shift cells that are used for input only signals.

The I/O block 216 facilitates the connection from shift register 212 and the update register 214 to the physical pins. The pins serves as I/O drivers with their tristate or direction control if needed, and input and output buffers. For pins that are always inputs or always outputs this requires only an assignment in the HDL code. When designing a short chain to program configuration devices (often serial proms) it may be necessary to utilize some of the pins as dedicated blocks.

The scan chain modification system 208 is configured to modify the number of cells or registers of the FPGA 202 that require programming to below a targeted cell threshold, or to meet the minimum number of cells necessary for programming the flash 204. The targeted cell threshold is the minimum number of cells required to have the FPGA 202 write data to and read data from the flash memory 204. In one or more non-limiting embodiments, the designer or component specifications of the CCA 100 indicate the minimum desired data or cells to be used.

In one or more embodiments, the scan chain modification system 208 includes a chain modification module 220 configured to modify the BSDL file 210 input to the scan chain modification system 208. In one or more embodiments, the chain modification module 220 generates Very High Speed Integrated Circuit Hardware Description Language (VHDL) code, which modifies (i.e., reduces) the FPGA scan chain to include only pertinent I/O's needed for programming.

For example, the BSDL file 210 specifies various elements of the scan chain including, but not limited to, the instruction register value, the physical pin map, the attribute boundary length, and the attribute boundary register. Accordingly, the chain modification module 220 can modify each of these elements in order to achieve the minimum scan chain necessary for programming the flash. By reducing the scan chain, flash memory can be programmed in significantly less time compared to conventional programming system that rely on the default FPGA scan chain provided by the vendor.

First, when programming the instruction register the chain modification module 220 changes the instruction register value corresponding to the controller test mode. More specifically, the TAP controller 206 typically uses a boundary scan code reserved for testing the FPGA 202. Therefore, the chain modification module 220 replaces the default boundary scan code with a user instruction code that essentially overrides the standard boundary scan test.

The chain modification module 220 can then modify the physical pin map to reflect a shortened scan chain. More specifically, the physical pin map that defines all the chip pins that are designated as in, out, buffer, or linkage. The linkage pins are used to for power, GND, or non-digital pins on a device. Therefore, the linkage pins can be utilized to ignore any pins on the FPGA 202 that are selected to be removed from the scan chain. In other words, the chain modification module 220 can set as "linkage" one or more pins of the scan chain that are unnecessary for programming a given device. Accordingly, pins set as "linkage pins" are effectively disabled, while the remaining pins among the total available pins of the FPGA 202 are enabled.

Once the linkage pins are set, the chain modification module 220 can modify the attribute boundary length to reflect the new length of the boundary scan chain. For example, a given FPGA 202 may have a default scan chain that includes 1658 programming elements (e.g., pins), each which require programming before the FPGA 202 can be controlled to program its corresponding flash memory 204. However, a given scenario may aim to program the flash 204 with only a small amount of data that requires, which in turn requires programming of only six pins to program the flash memory 204 rather than the entire 1658 elements. Therefore, the chain modification module 220 can set 1252 of the pins as "linkage" pins, and then modify the attribute boundary length to reduce the scan chain from 1658 down to 6, which provides an improvement factor of 276 times).

Once the attribute boundary length is established to define the reduced pin set, the chain modification module 220 modifies (i.e., reduces) the attribute boundary register to reflect the new scan chain. The modified attribute boundary length assigns cell types and pin numbers to the register bit corresponding each pin (in this example to each of the 6 pins). Accordingly, the scan chain modification system 208 can modify the default BSDL file 210, which in turn alters the internal structure (i.e., image) of the FPGA 202 to allow for reducing the time at which to program external memory chips (e.g., flash memory 204), e.g., by approximately two hundred times or better faster.

Figure 3:
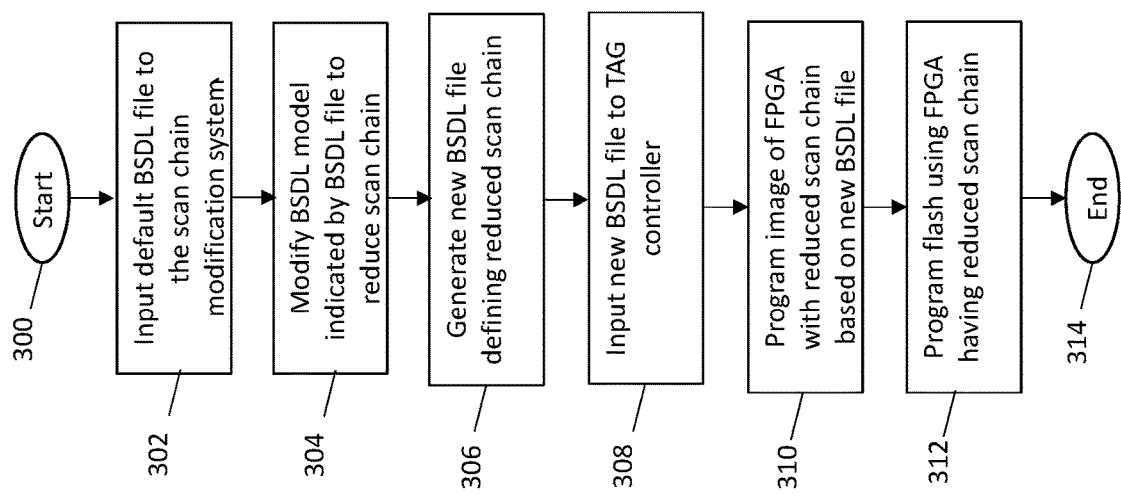
FIG. 3 is a flow diagram illustrating a method of programming non-volatile computer data storage.

Turning now to FIG. 3, a method of programming non-volatile computer data storage is illustrated according to a non-limiting embodiment. The method begins at operation 300, and at operation 302 a default BSDL file 210 is input to scan chain modification system 200. In one or more non-limiting embodiments, the default BSDL file 210 corresponds to a default BSDL model of an FPGA 202 to be used to program flash memory 204. At operation 304, the default BSDL model is modified to reduce the scan chain. In one or more non-limiting embodiments, a chain modification module 220 generates code (e.g., HDL code) that shortens the scan chain of the FPGA 202. At operation 306, a new BSDL file is generated. The new BSDL file reflects altered image of the FPGA 202 by defining the reduced scan chain. At operation 308, the new BSDL file is input to a TAP controller 206 and the FPGA 202 is programmed using the new BSDL file to set the reduced scan chain at operation 310. At operation 312, flash memory 204 is programmed using the FPGA 202, and the method ends at operation 314. Because the scan chain of the FPGA is reduced (e.g., only the minimum number pins needed to program the flash are established), the time needed to program the flash 204 is significantly reduced.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

A module can also be established as logic embodied in hardware or firmware, or to a collection of computer readable software instructions, written in a programming language including, but not limited to, VHDL, Verilog, Java, C, or assembly, and which is executed by one or more electronic microprocessors. One or more software instructions in the modules may be embedded in firmware, such as, for example, in an EPROM, and/or stored in any type of non-transitory computer-readable medium or other storage device.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:
1. A non-volatile computer data storage programming system comprises:
   a scan chain modification system configured to receive a default model defining a scan chain of an industry standardized device;

a controller in signal communication with the scan chain modification system, the controller configured to program an industry standardized device; and a non-volatile computer data storage device configured to receive data from the industry standardized device, wherein the scan chain modification system modifies the default model to generate a new model including a reduced scan chain, and wherein the controller programs the industry standardized device based on the new model such that the industry standardized device is programmed with the reduced scan chain.

2. The system of claim 1, wherein the industry standardized device having the new scan chain is configured to program the non-volatile computer data storage device.

3. The system of claim 2, wherein the scan chain defines a first register length, and wherein the scan chain modification system includes a chain modification module configured to modify the default model to generate the new model defining a new scan chain that defines a second register length that is less than the first register length.

4. The system of claim 3, wherein the chain modification module is configured to receive a default data file defining the default model and generates a new data file defining the new model.

5. The system of claim 4, wherein the chain modification module outputs the new data file to the controller, and wherein the controller configures the industry standardized device to have the second register length based on the new data file.

6. The system of claim 5, wherein the chain modification module modifies an attribute boundary length included in the new data file to reflect the second register length of the new scan chain.

7. The system of claim 1, wherein the industry standardized device is a field programmable gate array configured to operate according to a Joint Test Action Group (JTAG) protocol, and wherein the non-volatile computer data storage device is flash memory.

8. A scan chain modification system comprising:

a chain modification module configured to receive a default data file defining a model of an industry standardized device, and to generate a new data file that modifies the model, wherein the chain modification module is further configured to output the new data file to an industry standardized controller that configures the industry standardized device according to the modified model defined by the new data file.

9. The scan chain modification system of claim 8, wherein the modified model alters a scan chain of the industry standardized device used to program a non-volatile computer data storage device corresponding to the industry standardized device.

10. The scan chain modification system of claim 9, wherein the modified model alters the scan chain from a default register length to a new register length that is less than the default register length.

11. The scan chain modification system of claim 10, wherein the chain modification module modifies an attribute boundary length included in the new data file to reflect the new register length of the new scan chain.

12. The scan chain modification system of claim 11, wherein the chain modification module modifies a physical pin map of the industry standardized device to define the new scan chain.

13. The scan chain modification system of claim 12, wherein the chain modification module modifies the physical pin map by disabling a plurality of pins among the total available pins of the industry standardized device, while enabling at least one remaining pin among the total available pins of the industry standardized device.

14. The scan chain modification system of claim 8, wherein the industry standardized device is a field programmable gate array configured to operate according to a Joint Test Action Group (JTAG) protocol, and wherein the non-volatile computer data storage device is flash memory.

15. A method of programming non-volatile computer data storage device, the method comprising:

receiving, via a scan chain modification system, an input default model defining a scan chain of an industry standardized device, the scan chain defining a first register length;

modifying, via the scan chain modification system, the default model to generate a new model defining a new scan chain that defines a second register length that is less than the first register length;

programming, via a controller, the industry standardized device based on the new model such that the industry standardized device has the second register length; and programming the non-volatile computer data storage device using the FPGA operating according to the new scan chain.

16. The method of claim 15, further comprising:

modifying, via the scan chain modification system the default model to generate a new model defining a new scan chain that defines a reduced register length that is less than a default first register length of the industry standardized device.

17. The method of claim 16, further comprising:

inputting a default data file defining the default model to a chain modification module included in the scan chain modification system; and generating, by the chain modification module, a new data file defining the new model.

18. The method of claim 17, further comprising:

outputting, via the chain modification module, the new data file to the controller; and configuring, via the controller, the industry standardized device to have the second register length based on the new data file.

19. The method of claim 18, further comprising modifying, via the chain modification module, an attribute boundary length included in the new data file to reflect the second register length of the new scan chain.

20. The method of claim 15, wherein the industry standardized device is a field programmable gate array configured to operate according to a Joint Test Action Group (JTAG) protocol, and wherein the non-volatile computer data storage device is flash memory.

* * * * *